United States Patent
Ting et al.

(10) Patent No.: US 9,496,224 B2
(45) Date of Patent: Nov. 15, 2016

(54) SEMICONDUCTOR DEVICE HAVING AIR GAP STRUCTURES AND METHOD OF FABRICATING THEREOF

(71) Applicant: Taiwan Semiconductor Manufacturing Company, Ltd., Hsin-Chu (TW)

(72) Inventors: Chih-Yuan Ting, Taipei (TW); Jyu-Horng Shieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 14/278,967

(22) Filed: May 15, 2014

(65) Prior Publication Data
US 2015/0333011 A1 Nov. 19, 2015

(51) Int. Cl.
*H01L 21/311* (2006.01)
*H01L 23/532* (2006.01)
*H01L 21/768* (2006.01)
*H01L 23/522* (2006.01)
*H01L 21/764* (2006.01)

(52) U.S. Cl.
CPC ..... *H01L 23/53295* (2013.01); *H01L 21/7682* (2013.01); *H01L 21/7685* (2013.01); *H01L 21/76832* (2013.01); *H01L 21/76834* (2013.01); *H01L 21/76849* (2013.01); *H01L 21/76852* (2013.01); *H01L 23/5222* (2013.01); *H01L 23/5329* (2013.01); *H01L 23/53238* (2013.01); *H01L 21/764* (2013.01); *H01L 23/5223* (2013.01); *H01L 23/53223* (2013.01); *H01L 23/53266* (2013.01); *H01L 2924/0002* (2013.01)

(58) Field of Classification Search
CPC . H01L 21/762; H01L 21/467; H01L 21/308; H01L 21/28079; H01L 21/02126; H01L 21/02332; H01L 21/02642; H01L 21/02527; H01L 21/3212; H01L 21/76202; H01L 21/76831; H01L 21/67069; H01L 27/1104; H01L 29/435
USPC ....... 438/700, 680, 745, 197, 474, 475, 672, 438/746, 786, 791; 257/E21.006, E21.005, 257/E21.051, E21.053, E21.058, E21.17, 257/E21.126, E21.127, E21.229, E21.267, 257/E21.304, E21.347, E21.545, E21.547, 257/E21.564
See application file for complete search history.

(56) References Cited

U.S. PATENT DOCUMENTS

| | | | |
|---|---|---|---|
| 6,268,637 B1 | 7/2001 | Gardner et al. | |
| 6,764,919 B2 * | 7/2004 | Yu | H01L 21/7682 257/E21.581 |

(Continued)

FOREIGN PATENT DOCUMENTS

| | | |
|---|---|---|
| TW | 2005803166 | 1/2005 |
| TW | 200739815 | 10/2007 |
| TW | 201436101 | 9/2014 |

*Primary Examiner* — David Nhu
(74) *Attorney, Agent, or Firm* — Haynes and Boone, LLP

(57) ABSTRACT

One method includes forming a conductive feature in a dielectric layer on a substrate. A first hard mask layer and an underlying second hard mask layer are formed on the substrate. The second hard mask layer has a higher etch selectivity to a plasma etch process than the first hard mask layer. The second hard mask layer may protect the dielectric layer during the formation of a masking element. The method continues to include performing plasma etch process to form a trench in the dielectric layer, which may also remove the first hard mask layer. A cap is then formed over the trench to form an air gap structure adjacent the conductive feature.

19 Claims, 16 Drawing Sheets

(56) References Cited

U.S. PATENT DOCUMENTS

| | | |
|---|---|---|
| 8,951,911 B2 | 2/2015 | Naik et al. |
| 9,142,453 B1 | 9/2015 | Chiu et al. |
| 9,230,911 B2* | 1/2016 | Tsai .................. H01L 23/528 |
| 2008/0124912 A1* | 5/2008 | Liu .................. H01L 21/28273 |
| | | 438/622 |
| 2015/0137374 A1* | 5/2015 | Chen ................ H01L 23/53238 |
| | | 257/751 |
| 2015/0187696 A1* | 7/2015 | Tsai .................. H01L 21/7682 |
| | | 257/773 |
| 2015/0214143 A1* | 7/2015 | Tsai .................. H01L 23/5329 |
| | | 257/773 |
| 2015/0228572 A1* | 8/2015 | Yang ................. H01L 23/528 |
| | | 257/751 |
| 2015/0262873 A1 | 9/2015 | Chu et al. |
| 2015/0270225 A1 | 9/2015 | Yang et al. |

* cited by examiner

SEMICONDUCTOR DEVICE HAVING AIR GAP STRUCTURES AND METHOD OF FABRICATING THEREOF

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

As merely one example, interconnects, the conductive traces used to carry electrical signals between the elements that make up the circuit, are typically embedded in insulating material. Historically, this insulating material has been silicon dioxide. However, the relative permittivity (or dielectric constant) of silicon dioxide, a measure of the insulating properties, is relatively high. Certain low-k materials, with a dielectric constant lower than that of silicon oxide, have been suggested for replacing silicon dioxide and providing a dielectric material having a lower relative permittivity that can reduce interference, noise, and parasitic coupling capacitance between the interconnects. In fact, one manner of providing insulating properties with low relative permittivity is forming an air gap, as air has a low dielectric constant. However, fabrication processes for creating an air gap structure and air gap structures themselves, although existing in some embodiments that are generally adequate, they have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
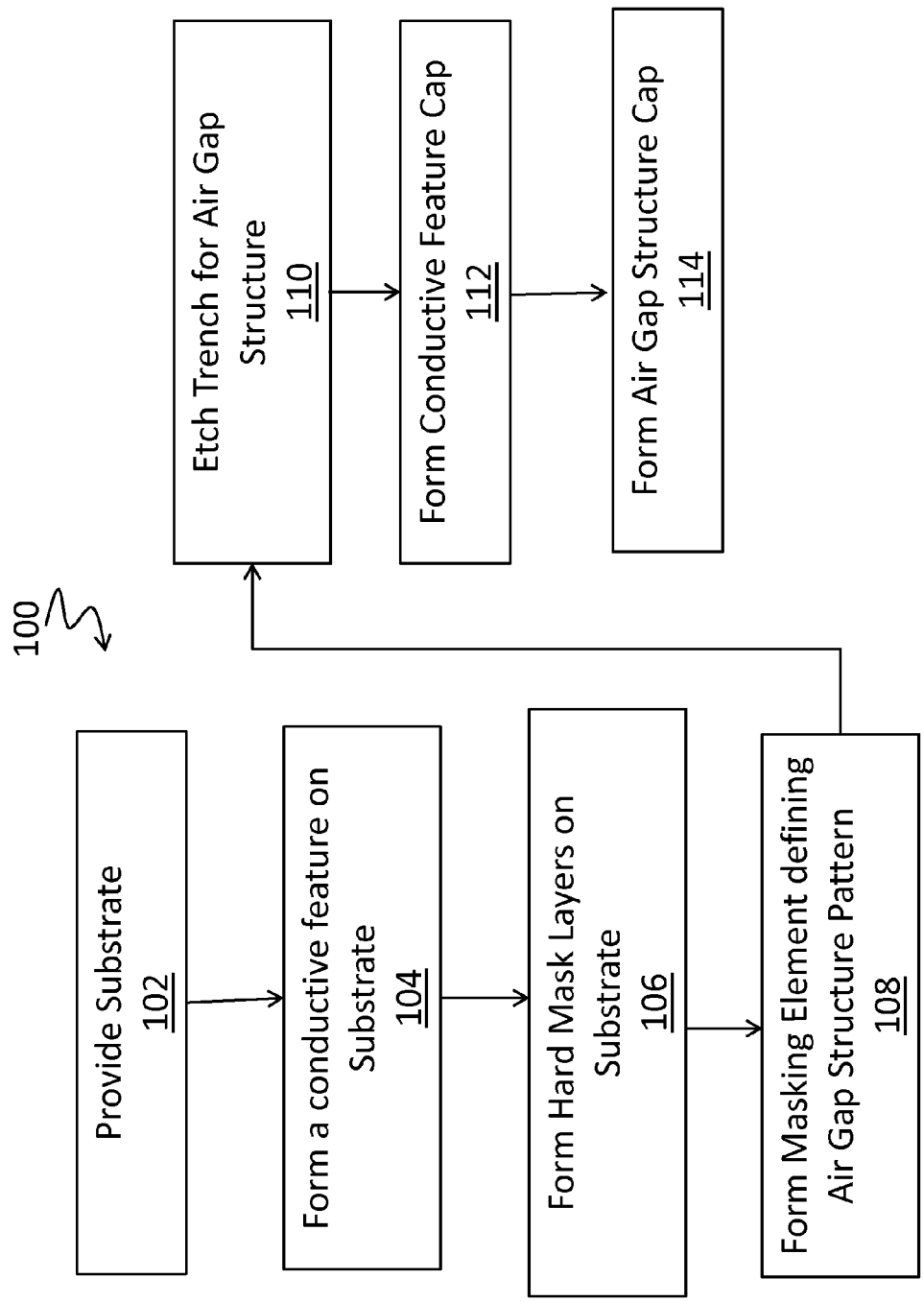
FIG. 1 is a flow chart illustrating an embodiment of a method of fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 to form a semiconductor device such as an integrated circuit having an interconnect structure with an air gap. FIGS. 2 through 11 illustrate sectional views of a semiconductor (or IC) device 200 during various stages of fabrication and constructed according to various aspects of the present disclosure and the method of FIG. 1. The method 100 and the device 200 are collectively described below. However, additional steps can be provided before, after or during the method 100, and some of the steps described herein may be replaced by other steps or eliminated. Similarly, further additional features may be present in the device 200, and/or features present may be replaced or eliminated in additional embodiments.

Referring to FIG. 1, the method 100 begins at block 102 where a substrate (e.g., wafer) is provided. Referring to the example of FIG. 2, a substrate 202 is provided. The substrate 202 may include silicon. Alternatively or additionally, the substrate 202 may include other elementary semiconductor materials such as germanium. The substrate 202 may be a compound semiconductor such as silicon carbide, gallium arsenide, indium arsenide, indium phosphide and/or other suitable materials. Further still, the substrate 202 may include an alloy semiconductor such as silicon germanium, silicon germanium carbide, gallium arsenic phosphide, gallium indium phosphide and/or other suitable alloy materials. In an embodiment, the substrate 202 includes an epitaxial layer (e.g., overlying a bulk substrate).

The substrate provided in block 102 and illustrated by exemplary substrate 202 also includes various features of semiconductor devices. For example, the substrate 202 may include p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistors (MOSFET), imaging sensors, light emitting diodes (LED), and/or other semiconductor devices. The substrate 202 may further include other functional features such as a resistor or a capacitor formed on and/or in substrate. The substrate 202 may further include isolation features provided to separate various devices such as, for example, shallow trench isolation (STI) features. The various semiconductor devices formed on the substrate 202 may further include other features, such as gate structures overlying channel regions.

The method 100 then proceeds to block 104 where a conductive feature is formed on the substrate. In an embodiment, the conductive feature is at least one layer of an interconnect structure. In an embodiment, the interconnect structure is a multi-layer interconnect structure including a plurality of conductive features such as metal lines, contacts and vias with interposing dielectric. The interconnect structure may be configured to electrically couple the various semiconductor features such as, p-type and/or n-type doped regions and the other functional features (such as gate electrodes), to provide a functional integrated circuit. In an embodiment, the interconnect structure (e.g., MLI) provides an electrical routing to couple devices on the substrate to input/output power and signals.

Figure 2:
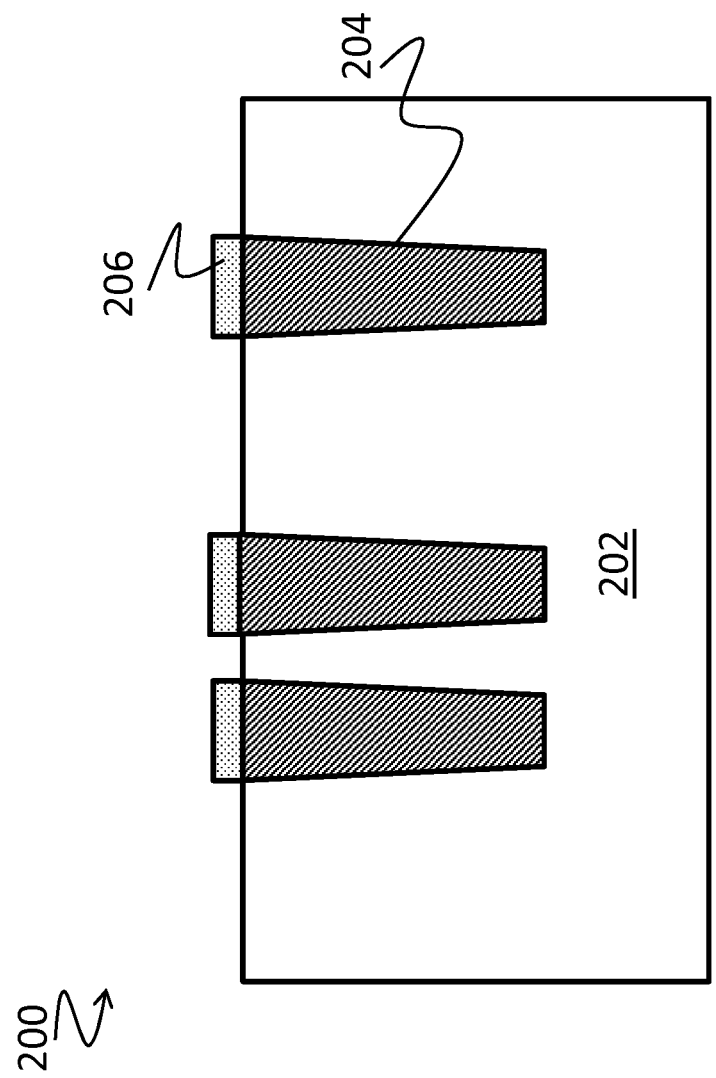
FIGS. 2-11 are cross-sectional views of a semiconductor substrate processed according to one or more steps of the method of FIG. 1 and are in accordance with some embodiments.
Figure 3:
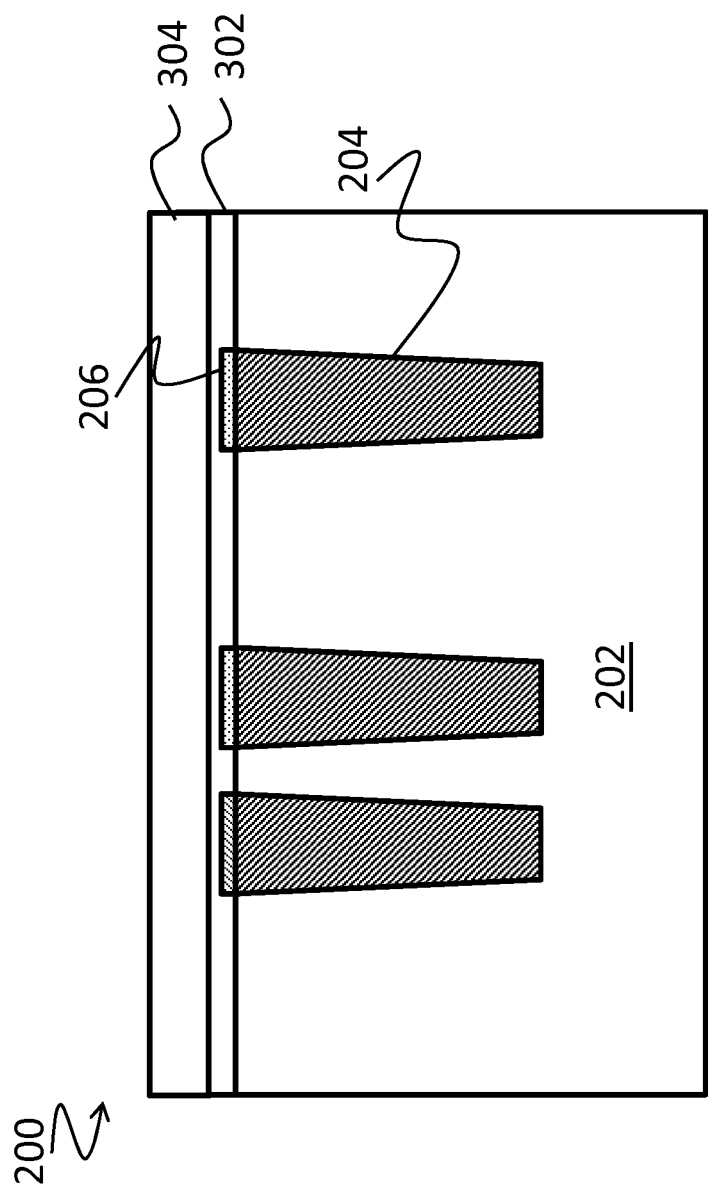

Exemplary conductive features 204 are shown in FIG. 2 for illustration. In an embodiment, the conductive features 204 are part of an interconnect structure. For example, conductive features 204 may be a contact, metal line, or metal via. In other embodiments, the conductive feature may be another type of feature such as a plate of a capacitor.

The conductive feature of block 104 and exemplified by conductive feature 204 may include aluminum (Al), copper (Cu), tungsten (W), and/or other suitable materials. In an embodiment, the conductive feature 204 includes a barrier layer for example, to prevent diffusion or improve adhesion. Example barrier layers include titanium nitride (TiN), tantalum nitride (TaN), tungsten nitride (WN), titanium silicon nitride (TiSiN), tantalum silicon nitride (TaSiN), and/or other suitable materials. The conductive features 204 may be formed by suitable processes such as lithography, etching, deposition, and the like.

The conductive features 204 may be surrounded by a dielectric material disposed on the substrate. In an embodiment, the dielectric material is a low-k dielectric material. In various examples, the low-k dielectric material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials as examples. In another example, the low k dielectric material may include an extreme low k dielectric material (ELK). In another example, the low k dielectric material layer includes a porous version of an existing Dow Corning dielectric material called FOX (flowable oxide) which is based on hydrogen silsesquioxane. The dielectric material may be formed by suitable processes such as spin-on coating or chemical vapor deposition (CVD). It is noted that a chemical mechanical polishing (CMP) process may be used to planarize the surface including the dielectric material and/or the conductive features 204.

In an embodiment, a cap is then formed on the conductive features. As illustrated in FIG. 2, a cap 206 is disposed on the conductive features 204. In an embodiment, the cap 206 includes cobalt (Co). The cap 206 may be formed by suitable processes such as chemical vapor deposition (CVD). The process may selectively deposit a material on the conductive feature (including for example a barrier layer discussed above). In other embodiments, including other embodiments of the device 200, the cap 206 may be omitted.

The method 100 then proceeds to block 106 where hard mask layers are formed on the substrate. The hard mask layers may be formed over the conductive feature, described above with reference to block 104. The hard mask layers may include a first hard mask layer and an underlying second hard mask layer. Referring to the example of FIG. 3, hard mask layers 302 and 304 are disposed on the device 200. The hard mask layer 302 is referred to herein as a second hard mask layer. The hard mask layer 304 as a first hard mask layer.

In an embodiment, the first hard mask layer 304 is a dielectric composition such as, for example, SiCN, SiN, $SiO_2$, SiON, and/or other suitable compositions. In an embodiment, the second hard mask layer 302 contains a metal (M) and an oxygen (O) and/or nitrogen (N) component. Example metal compositions include Al, Mn, Co, Ti, Ta, W, Ni, Sn, and Mg. The second hard mask layer composition may be referred to as $M_xO_yN_z$. In an embodiment, x is between approximately 20% and approximately 70%, in weight. In an embodiment, y is between 0% and approximately 80%, in weight. In an embodiment, z is between 0% and approximately 80%, in weight. In an embodiment, y and z are greater than x. This may, for example, prevent bridging. Thus, exemplary compositions of the second hard mask layer 302 include, but are not limited to, AlON and AlN. In an embodiment, the second hard mask layer 302 has one or more of the compositions discussed here, and is an insultative material including, for example, those of composition $M_xO_yN_z$ discussed above.

Generally, the composition of the first hard mask layer 304 and the second hard mask layer 302 are selected such that the second hard mask layer 302 has a high etch selectivity as compared to the first hard mask layer 304 (i.e., the second hard mask layer 302 having a substantially slower etch rate such that the etch process will etch the first hard mask layer and leave the second hard mask layer unharmed). In an embodiment, the etch selectivity with respect a plasma etch. In an embodiment, the etch selectivity is with respect to an etch of an underlying dielectric layer (e.g., low-k dielectric) such as used to form a trench as discussed below. Further, in embodiments, the second hard mask layer 302 composition is selected such that it can be removed through a wet etch process as discussed below.

In an embodiment, the second hard mask layer 302 has a thickness between approximately 5 Angstroms and approximately 50 Angstroms. The second hard mask layer 302 may be formed using deposition methods such as, atomic layer deposition (ALD), chemical vapor deposition (CVD), physical vapor deposition (PVD), coating, and/or other suitable methods.

Figure 14:
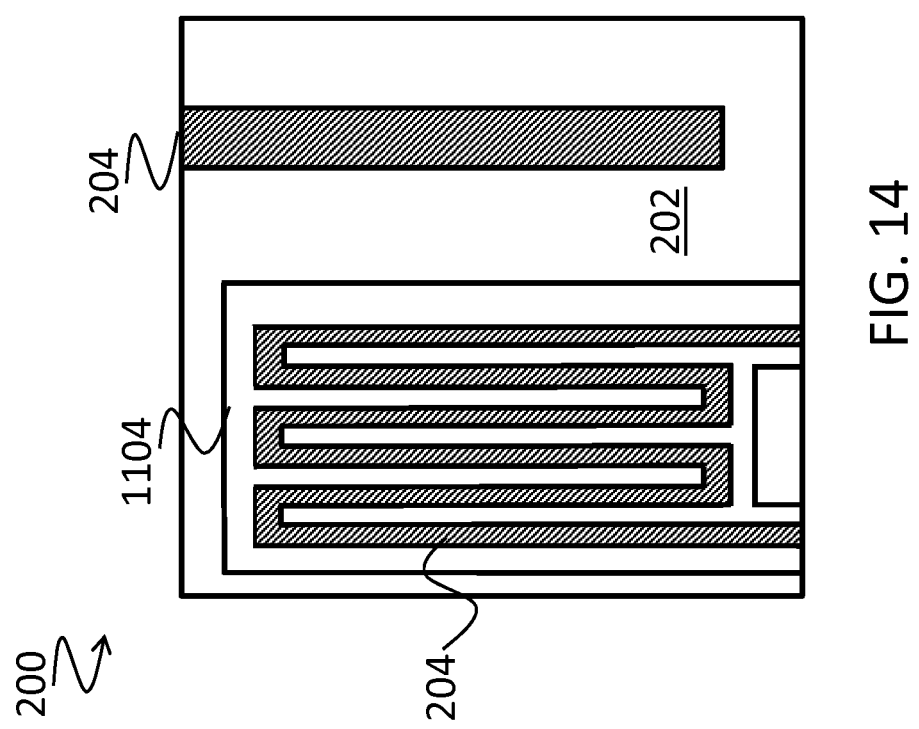
FIG. 14 is a top view of a semiconductor device having an air gap according to one or more aspects of the present disclosure.

After forming the hard mask layers, the method 100 proceeds to block 108 where a masking element (or elements) defining an air gap structure pattern is formed. FIG. 14 is illustrative of a top view of an embodiment of an air gap structure 1104, however other patterns are possible and within the scope of the present disclosure. The forming of the mask elements may include a plurality of steps as discussed below.

In an embodiment, a step in forming a masking element defining the pattern includes forming a photosensitive material disposed on the substrate and in particular disposed on the hard mask layers. The photosensitive material is patterned using suitable lithography techniques. The patterned photosensitive material includes various openings that define and expose portions of the substrate for subsequent etchings. Referring to the example of FIG. 4, a patterned photoresist layer 402 is disposed on the hard mask layer 304. The photoresist layer 402 includes openings 404 for sequent etching. The openings 404 define the pattern for the subsequently formed air gap structure. In particular, the openings 404 are aligned with respective conductive features 204 adjacent which an air gap structure is desired.

In an embodiment, the patterned photoresist layer 204 is formed by suitable procedures including coating, exposure, post exposure baking, and developing. For example, the photoresist coating may be formed using a spin-on coating. In an example, the coated photoresist layer is selectively exposed by radiation beam through a mask having a predefined pattern. The radiation beam includes ultraviolet (UV) light in one example. The exposing process may be further extended to include other technologies such as a maskless exposing or writing process. After the exposing process, photoresist is further processed by a thermal baking process, a post exposure bake (PEB). Thereafter, the exposed photoresist layer is developed such that the exposed resist portion is dissolved and washed away during the developing process. The lithography processes described above may only present a subset of processing steps associated with a lithography patterning technique. The lithography process may further include other steps such as cleaning and baking in a proper sequence. For example, the developed resist layer may be further baked, referred to as hard baking. Moreover, additional materials may be used such as multi-layer resist compositions, antireflective coatings, and/or other suitable layers.

Figure 4:
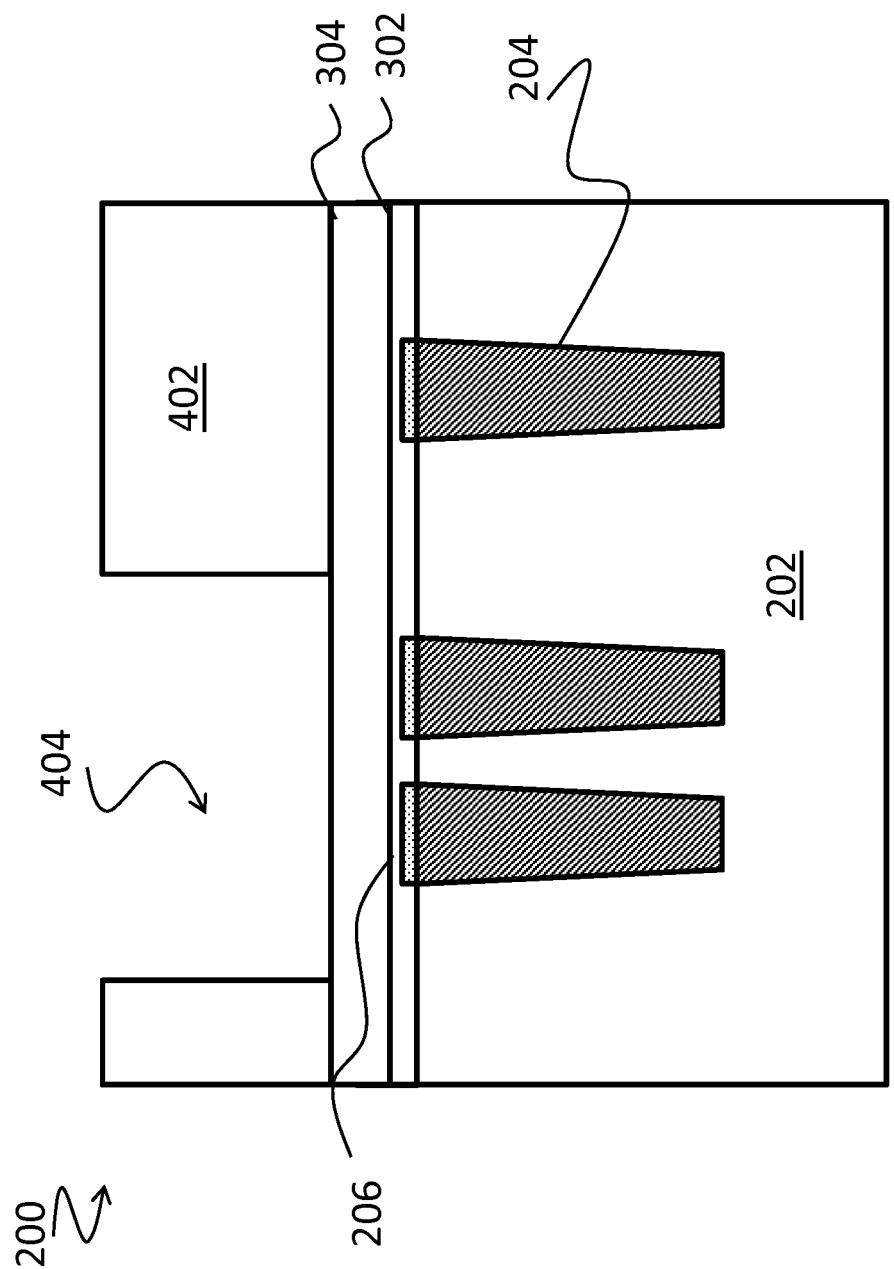
Figure 5:
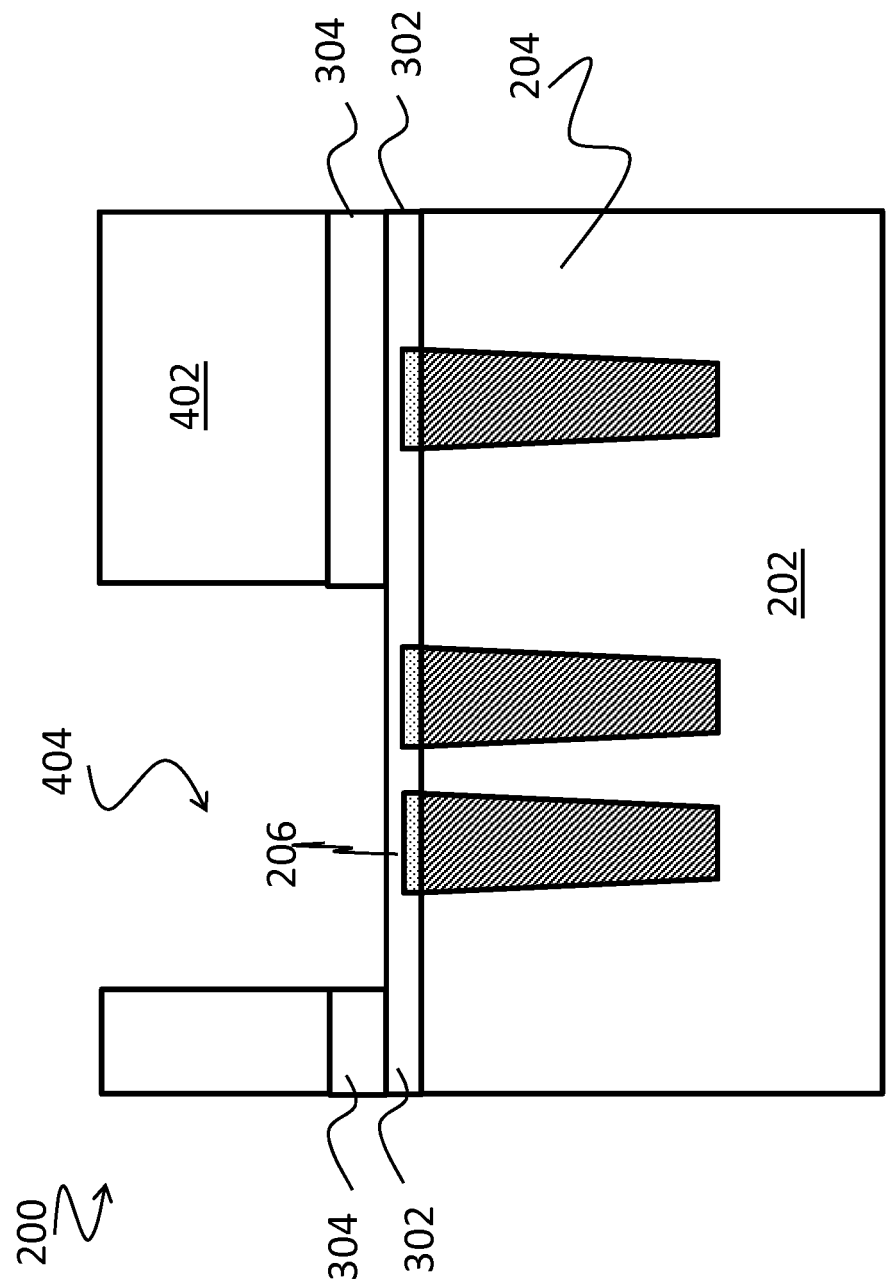
Figure 6:
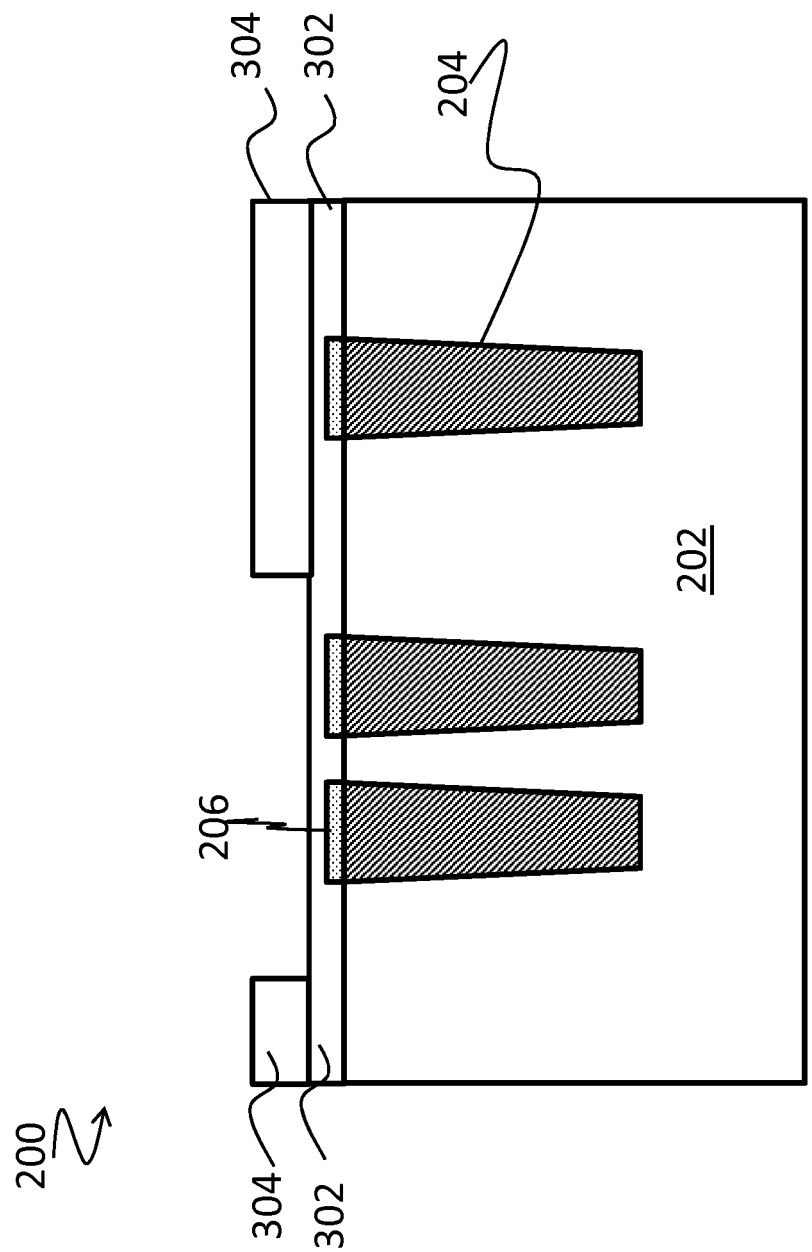

After forming a masking element of photoresist as illustrated by patterned photoresist 402 of FIG. 4, the masking element of patterned photoresist is used to selectively etch the exposed hard mask layer. Referring to the example of FIG. 5, the first hard mask layer 304 is etched through the openings 404 in the photoresist 402. It is noted that the etching may stop on the second hard mask layer 302. In an embodiment, the etch selectivity of the composition of the second hard mask layer 302 to the etch selectivity of the first hard mask layer 304 provides an appropriate etch stop.

After etching the first hard mask layer, the patterned photosensitive (photoresist) layer may be removed from the substrate. In an embodiment, the patterned photosensitive layer is stripped. Referring to the example of FIG. 6, the photoresist layer 402 has been removed from the substrate. The photoresist layer 402 may be removed by a process such as wet stripping or $O_2$ plasma ashing. It is noted that during the removal of the photoresist layer 402, the dielectric material formed on the substrate 202 such as the low-k dielectric material or extreme low-k dielectric material, is protected from potential damage from the stripping process and/or chemicals. This is because the second hard mask layer 302 covers exposed regions during the removal process.

After removal of the photoresist layer, the exposed second hard mask layer (e.g., the portion not underling the patterned first hard mask layer) is removed by an etching process. In an embodiment, the etching is a wet etch process. Exemplary compositions of the wet etch include acid and/or oxidant. In one example, the wet etch includes an acid of fluorine (F) and/or an oxidant of peroxide ($H_2O_2$). Referring to the example of FIG. 7, the exposed portions of the hard mask layer 304 have been removed. In other words, the portions of the hard mask layer 304 that underlie the openings 404 are removed from the substrate 202, for example, by wet etching as discussed previously.

Figure 7:
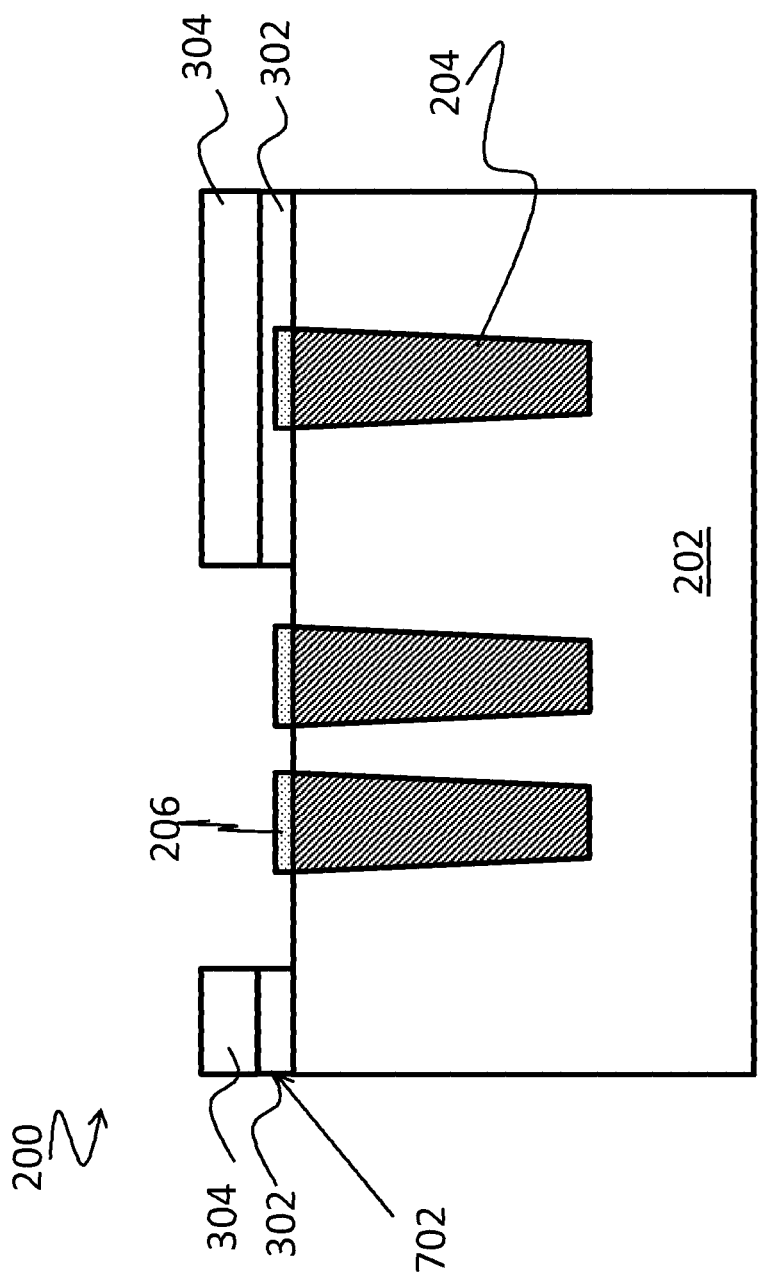
Figure 8:
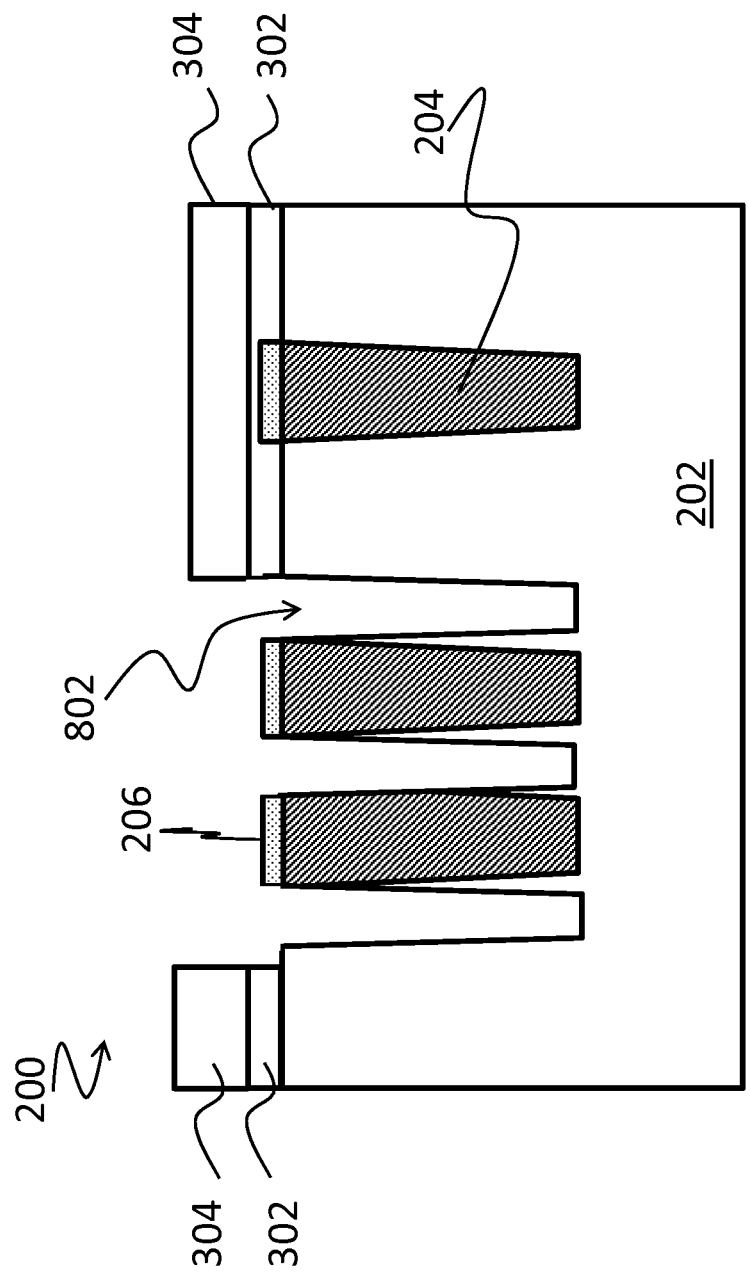
Figure 9:
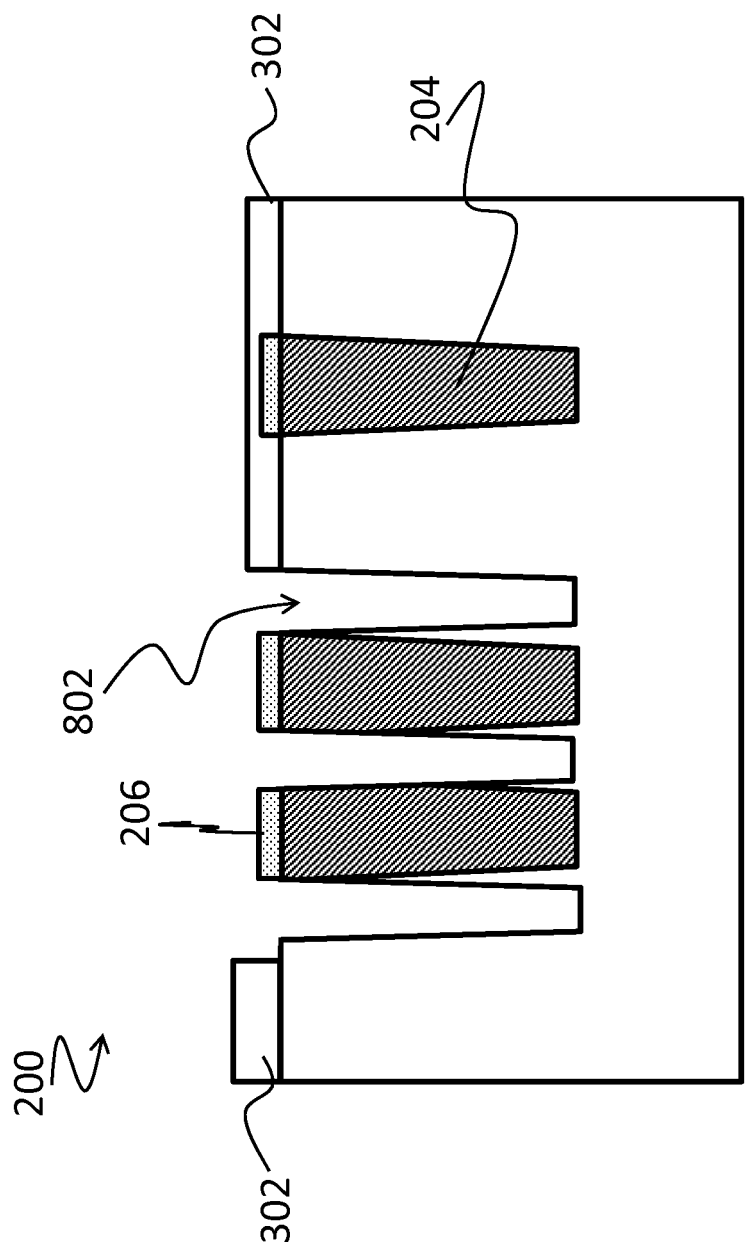

Thus, referring to FIGS. 1 and 7, a masking element 702 is formed that defines an opening over the conductive features 204 for which an air gap is desired. Specifically, FIG. 7 illustrates the masking element 702 including the patterned second hard mask layer 302. This masking element may formed using one or more of the steps of block 108 discussed above and after formation may be used for subsequent patterning of the substrate 202 as discussed below. The masking element protects portions of the underlying layer(s) and/or substrate, while exposing other portions according to a pattern.

After forming the masking element in block 108, the method 100 proceeds to block 110 where a trench or trenches for the air gap structure are etched in the substrate. Specifically the trench(es) for the air gap structure are etched in a dielectric layer of the substrate, such as a low-k dielectric layer that surrounds the conductive features. In an embodiment, the masking element of block 108 is used to define the openings in the low-k dielectric layer to be etched. Referring to the example of FIG. 8, the masking element 702 including the hard mask layer 302 is used to define trenches 802 that will form the air gap structure. The trenches 802 are formed in a dielectric material of the substrate 202 such as the low-k dielectric. In an embodiment, the trenches 802 are adjunct to and extend at least to the bottom of the conductive features 204. In an embodiment, the trenches 802 are formed substantially similar to the pattern illustrated by FIG. 14 and element 1104. In an embodiment, the trenches 802 are filled with air.

In an embodiment, after the etching of the trenches 802, a wet cleaning process is performed. In an embodiment, during the etching the trenches to form the air gap, the first hard mask 304 may also be removed from the substrate 202. For example, in an embodiment, the composition of the second hard mask layer 302 is such that it is not appreciably etched by the etching of the trenches 802; however, the composition of the hard mask layer 304 may be such that it is removed, in whole or in part, from the substrate 202.

The etching process of block 110 and/or the formation of trenches 802 may be a plasma etch process. In an embodiment, as discussed above, the composition of the second and first hard mask layers are selected such that the second hard mask layer has a higher etch selectivity to the (e.g., plasma) etching process of block 110 and/or the etching of trenches for the air gap structure. As such, the etching of block 110 may remove the first hard mask layer (304) while the second hard mask layer 302 remains relatively and substantially unchanged in its thickness.

In an embodiment, after etching the substrate 202 (dielectric layer), the cap 206 is removed by a suitable etching process. This embodiment is discussed in further detail below with reference to FIG. 12. In an embodiment, the cap 206 is removed only on the exposed conductive features 204 or those adjacent the air cap structure.

The method 100 then proceeds to block 112 where a conductive feature cap is formed. In an embodiment, the conductive feature cap in the present step is in addition to the cap 206 discussed above with reference to FIG. 2. In another embodiment, the conductive feature cap in the presently discussed step is formed directly on the conductive feature. This may be a result of a process where the cap 206, discussed above with reference to FIG. 2, is omitted from the method or removed in another process, see the discussion above. The conductive feature cap may be selectively formed or deposited only on the conductive feature. Referring to the example of FIG. 10, the conductive feature cap 1002 is disposed on the conductive features 204. In an embodiment, the conductive feature cap 1002 enhances reliability of the device 200 and, for example, the conductive feature 304. In an embodiment, the conductive feature cap 1002 is cobalt (Co).

It is noted that the previously discussed cap 206 may oxidize during the fabrication process. As such, an oxidized layer may be present between the cap 206 and the cap 1002, not specifically shown. Thus, in one embodiment, the cap 206 as deposited is Co and the cap 1002 as deposited is Co. However, due to the oxidation of the cap 206 prior to the deposition of cap 1002, an oxidation layer will be present within the feature formed by the summation of cap 206 and cap 1002 (e.g., at the surface region of the as deposited cap 206).

In some embodiments, after the formation of the cap 1002, a barrier layer may be formed on the substrate 202. This barrier layer may be substantially similar to the barrier layer 1302 discussed below with reference to FIG. 13.

The method 100 then proceeds to block 114 where the cap structure for the air gap structure is formed on the substrate. In an embodiment, the air gap cap structure is formed by chemical vapor deposition (CVD), physical vapor deposition (PVD), coating process, and/or other suitable process. In an embodiment, the air gap cap structure is a ceramic having a metal (M) and O and/or N composition. Exemplary metals include Al, Mn, Co, Ti, Ta, W, Ni, Sn, and Mg. The M, O and N composition of the air gap cap structure may be referred to as $M_xO_yN_z$. In an embodiment, x is between approximately 20% and approximately 70%, in weight. In an embodiment, y is between 0% and approximately 80%, in weight. In an embodiment, z is between 0% and approximately 80%, in weight. In an embodiment, y and z are greater than x. This may, for example, prevent bridging. In another embodiment, the air gap cap structure is a dielectric film such as, for example, SiCN, SiN, $SiO_2$, SiON, SiOC, SiOF, and/or other suitable dielectric material. In another embodiment, the air gap structure cap material is an organic polymer film such as $C_xH_yO_z$, where x, y, and z are ≥0.

Figure 11:
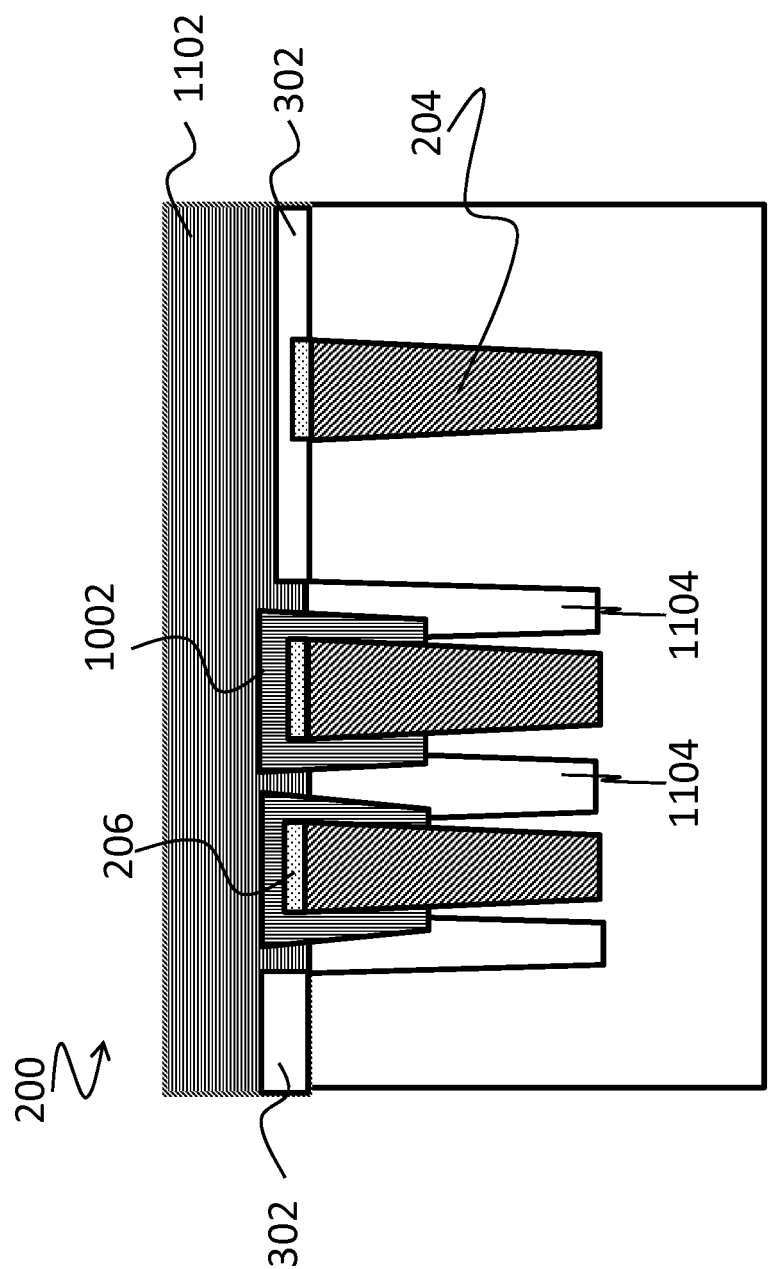

Referring to the example of FIG. 11, an air gap cap structure 1102 is illustrated on the substrate 202. In an embodiment, the air gap cap structure 1102 forms a cap or upper wall for the air void in the trenches 802, thereby forming an air gap 1104.

Figure 12:
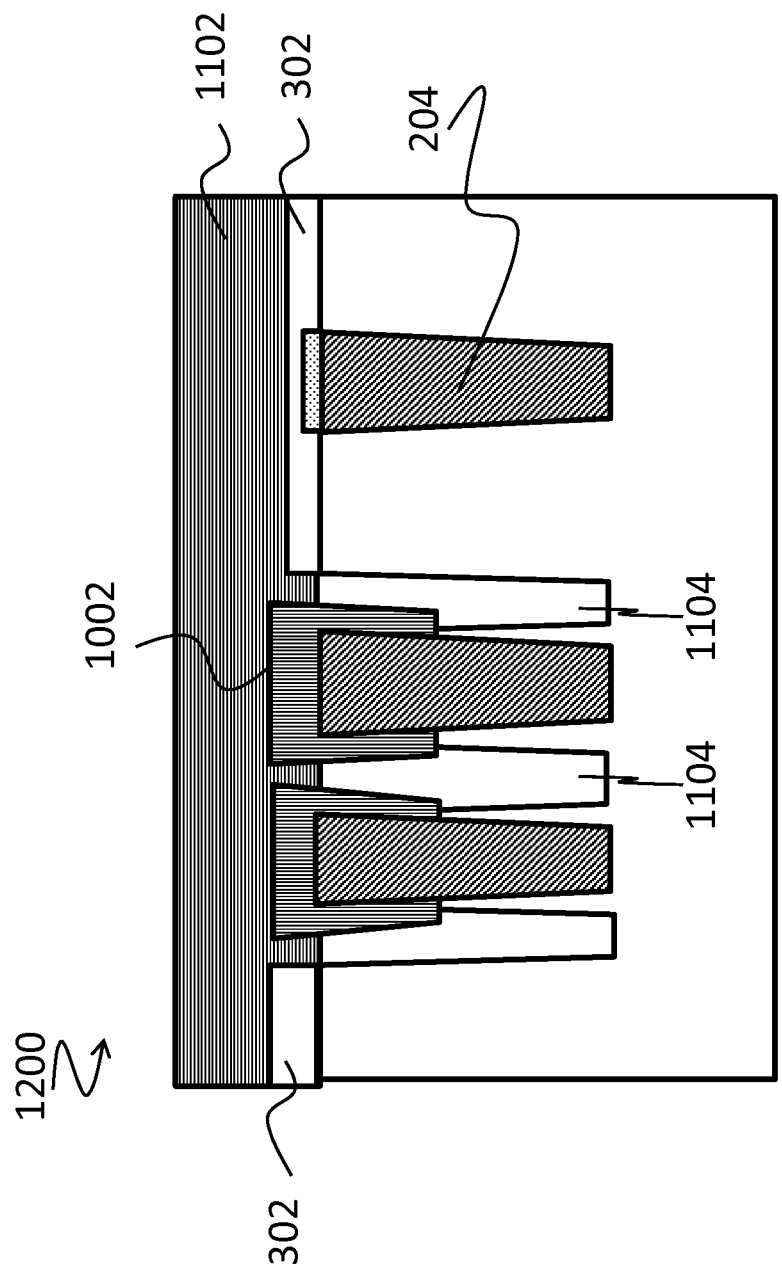
FIG. 12 is another embodiment of a semiconductor device fabricated in accordance with some embodiments.
Figure 13:
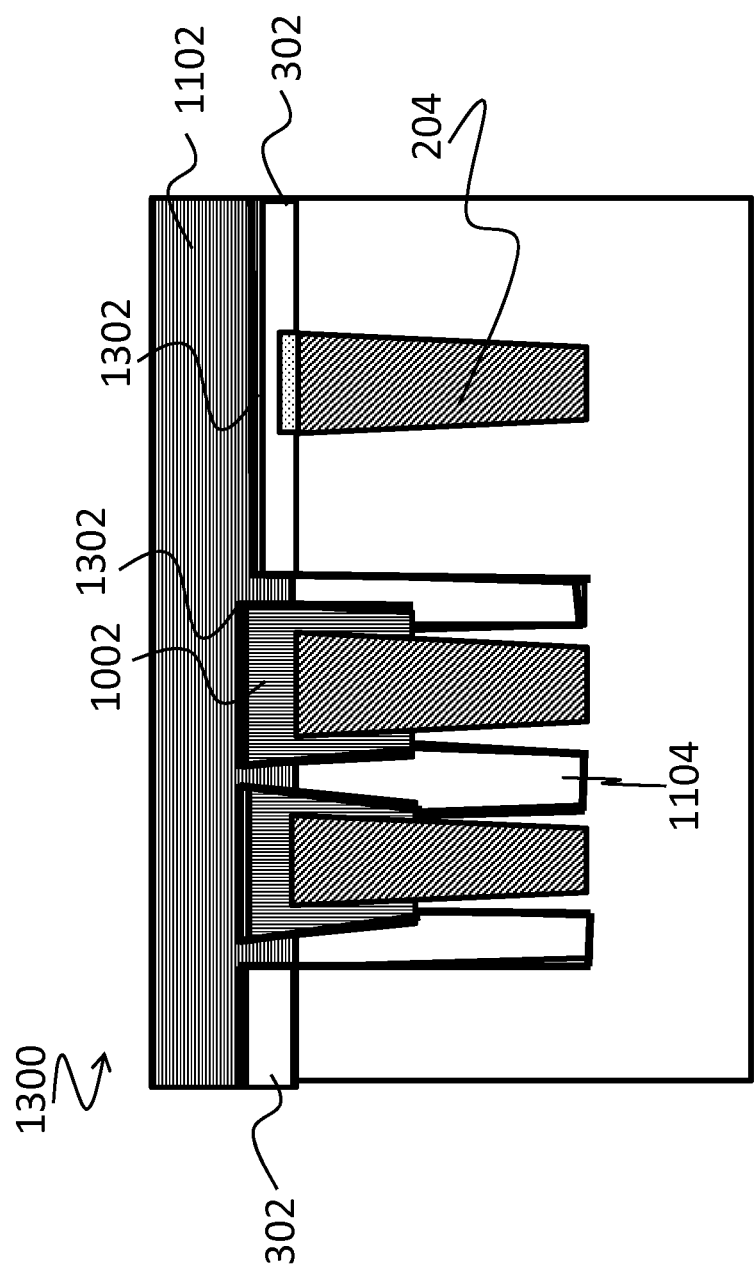
FIG. 13 is yet another embodiment of a semiconductor device fabricated in accordance with some embodiments.

While FIG. 11 is one embodiment of a semiconductor device having a conductive feature 204 with an adjacent air gap 1104, other embodiments are possible including but not limited to those illustrated in FIGS. 12 and 13. FIG. 12 is illustrative of a device 1200 substantially similar to as discussed above with reference to device 200 of FIGS. 2 through 11 and may be formed in substantially the same manner including the use of the method 100 of FIG. 1 with differences noted herein. As illustrated by the device 1200, the cap 206 is not retained on the device 1200. Rather the cap structure 1002 is formed directly on the conductive feature 204. In the device 1200, there is no oxidation layer within the resultant cap structure (compare the summation of caps 206, 1002 discussed above). Thus, in an embodiment, the cap 1002 is substantially a uniform composition (e.g., Co) within the cap 1002.

FIG. 13 is illustrative of a device 1300 substantially similar to as discussed above with reference to device 200 of FIGS. 2 through 11 and may be formed in substantially the same manner including the use of the method 100 of FIG. 1 with differences noted herein. As illustrated by the device 1300, a barrier layer 1302 is formed on the device 1300. The barrier layer 1302 may be approximately 10 Angstroms to approximately 50 Angstroms in thickness, by way of example. The barrier layer 1302 may be formed by atomic layer deposition (ALD). In an embodiment, the ALD process ensures adequate coverage of the barrier layer 1302 on the sidewalls of the features of the device 1300. The device 1300 may include, or not include, the cap 206 as discussed above.

In an embodiment, the barrier layer 1302 is a ceramic having a metal (M), O and/or N composition. Exemplary metals include Al, Mn, Co, Ti, Ta, W, Ni, Sn, and Mg. The M, O and N composition of the barrier layer 1302 may be referred to as $M_xO_yN_z$. In an embodiment, x is between approximately 20% and approximately 70%, in weight. In an embodiment, y is between 0% and approximately 80%, in weight. In an embodiment, z is between 0% and approximately 80%, in weight. In an embodiment, y and z are greater than x. This may, for example, prevent bridging.

In another embodiment, the barrier layer 1302 is a dielectric film such as, for example, SiCN, SiN, $SiO_2$, SiON, SiOC, SiOF, and/or other suitable dielectric material. It is noted that FIG. 13 illustrates the device 1300 without the cap 206, as discussed above with reference to FIG. 12. However, in another embodiment of the device 1300, the cap 206 and/or the cap 1002 are disposed on the device 1300 including on the conductive features 204 having the air gap 1104 adjacent.

In an embodiment, the air gap structure 1104 may be defined by filling or re-filling the barrier layer 1302 (e.g., dielectric) and/or by depositing subsequent films including for example, air gap cap structure 1102.

Figure 10:
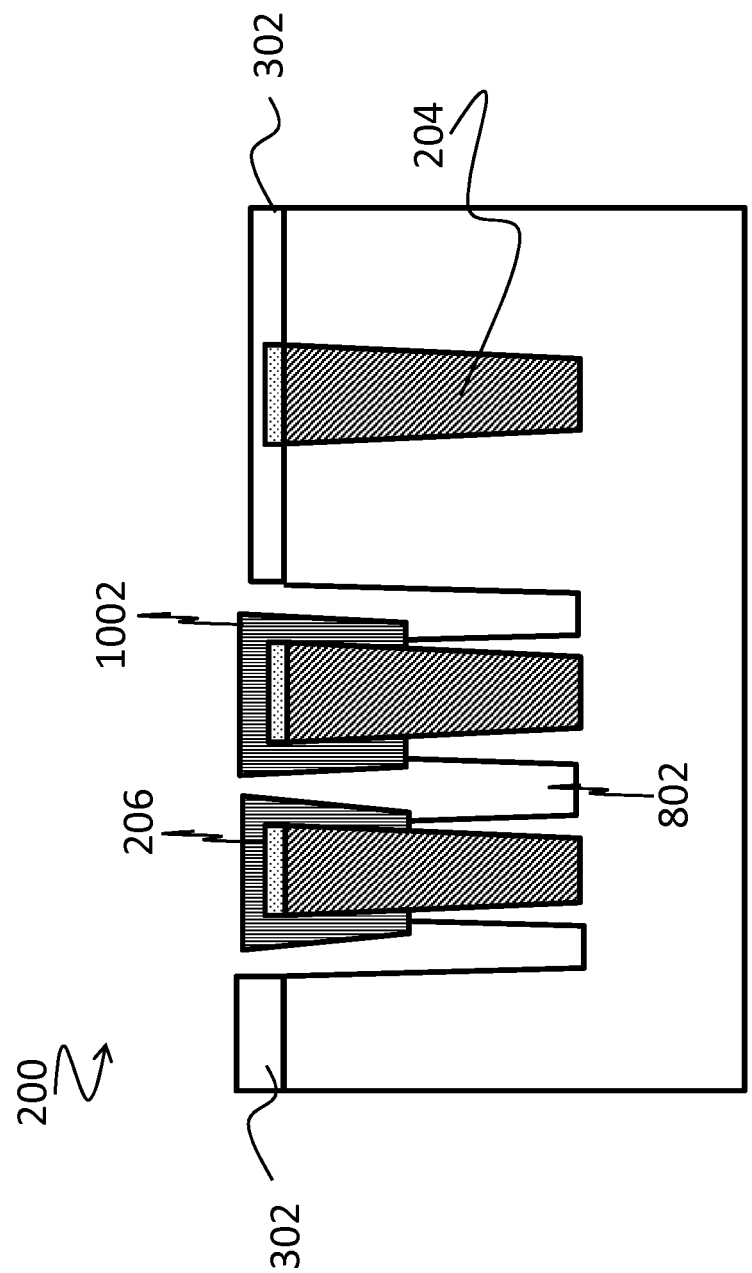

Thus, it will be appreciated that discussed herein are embodiments of methods of forming air gap structures that provide for protection of the low-k dielectric layer during processes such as, for example, stripping of photoresist masking elements. Further, provided are embodiments of semiconductor devices having conductive features having a "matchstick structure." In embodiments, the conductive features are features of interconnect structures such as metal lines or vias. The "matchstick structure" is illustrated by FIG. 10 and the formation of the metal cap 1002 (and/or cap 206) on the conductive feature 204. This structure is also illustrated by FIGS. 11, 12 and 13 wherein the "matchstick structure" of the conductive feature 204 and cap 1004 (and/or cap 206) are disposed under the air gap cap structure 1102. This structure may offer benefits in device performance and/or reliability. In some embodiments, the structure can reduce via landing overlay issues.

Figure 15:
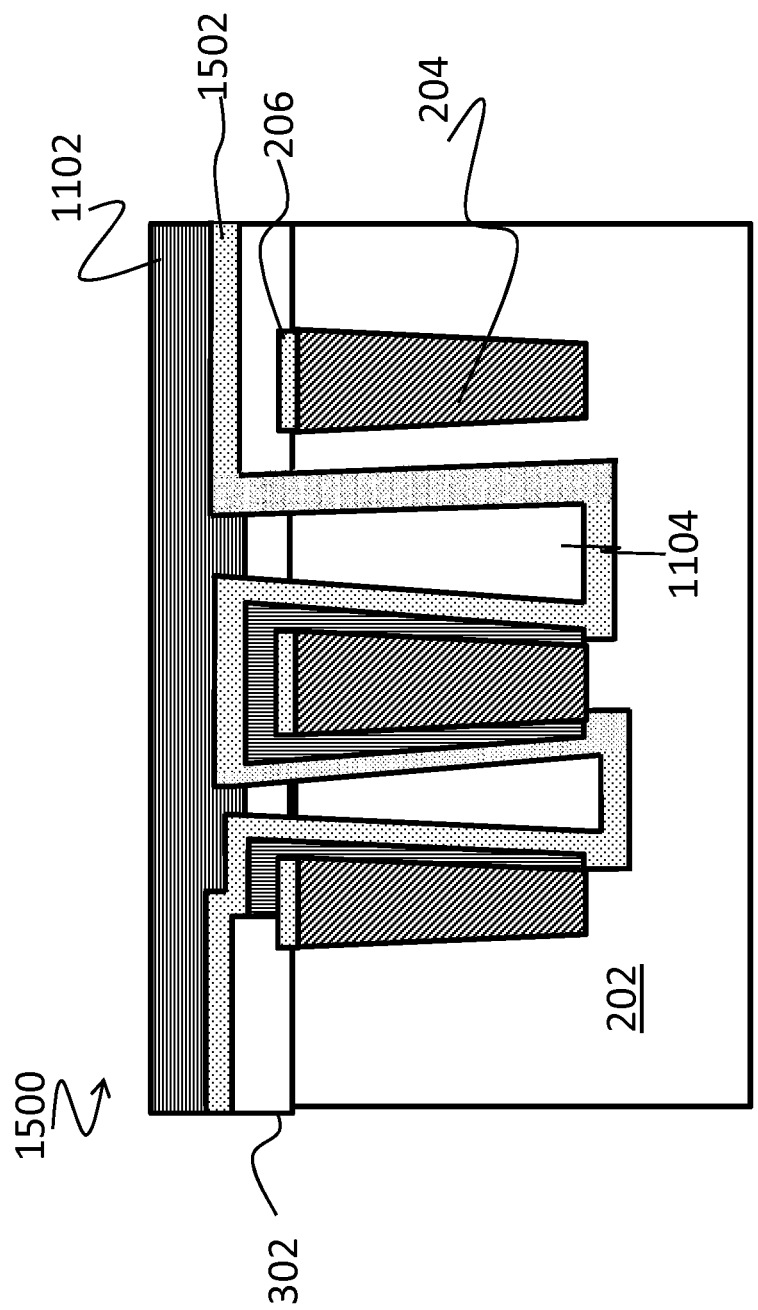
FIG. 15 is another embodiment of a semiconductor device fabricated in accordance with some embodiments.
Figure 16:
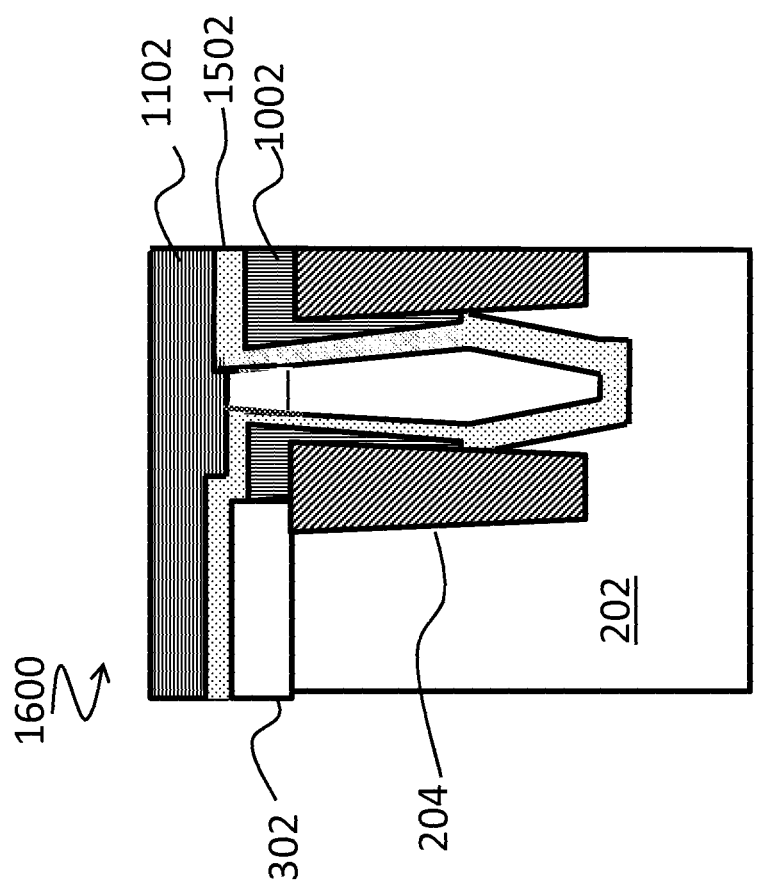
FIG. 16 is yet another embodiment of a semiconductor device fabricated in accordance with some embodiments.

Referring now to FIGS. 15 and 16, illustrated are additional structural embodiments of devices 1500 and 1600 respectively. One or more of these devices may be formed using the method of FIG. 1. Elements that may be substantially similar to the above description are identified in devices 1500 and/or 1600 with the same reference number for ease of understanding. It is noted that FIGS. 15 and 16, like the embodiments above, are representative only and not intended to be limiting beyond what the explicitly recited in the claims that follow. For example, modification that may be provided to the devices described herein, including those of FIGS. 15 and 16 include, but are not limited to, differences in the air gap profile. For example, the air gap 1104 as illustrated in FIG. 15 has a wider bottom width than top width; however, in other embodiments, the top width may be wider than the bottom width, the width may vary throughout the air gap, and/or other profile variations. The profile of the air gap 1104 may be further dependent upon the thickness of the barrier layer 1502 and/or the thickness and configuration of the conductive feature cap 1002, discussed below.

FIG. 15 illustrates a device 1500 substantially similar to as discussed above with reference to device 200 of FIGS. 2 through 11 and FIG. 14, the device 1200 of FIG. 12, the device 1300 of FIG. 13, and may be formed in substantially the same manner including the use of the method 100 of FIG. 1 with differences noted herein. Reference numerals are repeated for ease of understanding.

As illustrated by the device 1500, a barrier layer 1502 is formed on the device 1500. The barrier layer 1502 may be substantially similar to the barrier layer 1302, discussed above with reference to FIG. 13. The barrier layer 1502 may be approximately 10 Angstroms to approximately 50 Angstroms in thickness, by way of example. The barrier layer 1502 may be formed by atomic layer deposition (ALD). The barrier layer 1502 may be a dielectric. Exemplary dielectric materials include, but are not limited to, SiCN, SiN, SiO$_2$, SiON, SiOC, SiOF, and/or other suitable dielectric material. The barrier layer 1502 is provided disposed on surfaces of the hard mask 302, the cap 1504 (discussed below), the substrate 202, and/or any available surface of the device 1500 at the time of deposition. The barrier layer 1502 may be a blanket layer having a substantially consistent thickness. As illustrated in FIG. 15, the barrier layer 1502 is disposed on the sidewall of the conductive feature 204 over the conductive feature cap 1002; the barrier layer 1502 is also disposed on a bottom wall of the air gap 1104 defined by the substrate 204.

It is noted that FIG. 15 illustrates the device 1500 with the cap 206, as discussed above with reference to FIG. 12. However, in another embodiment of the device 1500, the cap 206 and/or the cap 1002 are disposed on the device 1300 including on the conductive features 204 having the air gap 1104 adjacent.

The device 1500 includes a conductive feature cap 1002, which may be substantially similar to as discussed above with reference to FIGS. 10, 11, 12, 13 and/or 14. The conductive feature cap 1002 may be selectively formed or deposited only on the conductive feature (e.g., 204). In other words, the conductive feature cap 1002 is not disposed on other regions of the substrate such as, dielectric materials. As illustrated above, the substrate 202 may be a dielectric region of the substrate. Thus, in an embodiment, the conductive feature cap 1002 is not disposed on the sidewalls of the feature 1104 defined by the substrate 202 (dielectric). Referring to the example of FIG. 15, the conductive feature cap 1002 is disposed on the conductive features 204. FIG. 15 illustrates the conductive feature cap 1002 extending the depth of the air gap structure 1104. However, other embodiments are possible including where the cap extends a portion of the depth of the structure 1104. In an embodiment, the conductive feature cap 1002 is cobalt (Co). As also illustrated in FIG. 15, a conductive feature 204 may include the conductive feature cap 1002 on one sidewall of the conductive feature 204 (e.g., and not on an opposing sidewall, see left most conductive feature 204 of FIG. 15). In an embodiment, the conductive feature 204 is copper. Thus, in a further embodiment, one (or more than one) conductive feature 204 defines a sidewall having copper, a conductive feature cap (1002), and a dielectric barrier layer 1502. A cap 206 (e.g., Co) It previously discussed cap 206 may oxidize during the fabrication process. As such, an oxidized layer may be present between the cap 206 and the cap 1002, not specifically shown. Thus, in one embodiment, the cap 206 as deposited is Co and the cap 1002 as deposited is Co. However, due to the oxidation of the cap 206 prior to the deposition of cap 1002, an oxidation layer will be present within the feature formed by the summation of cap 206 and cap 1002 (e.g., at the surface region of the as deposited cap 206).

Referring now to FIG. 16, illustrated is a portion of a device 1600. The device 1600 may be substantially similar to as discussed above with reference to device 200 of FIGS. 2 through 11 and FIG. 14, the device 1200 of FIG. 12, the device 1300 of FIG. 13, device 1500 of FIG. 15, and may be formed in substantially the same manner including the use of the method 100 of FIG. 1 with differences noted herein. Reference numerals are repeated for ease of understanding.

As illustrated by the device 1600, the substrate 202 (e.g., dielectric region), the conductive feature 204, hard mask layer 302, barrier layer 1502, air gap 1104, and air gap structure cap 1102 are substantially similar to as discussed above. However, FIG. 16 illustrates the cap 1002 disposed on the conductive feature 204 such that it extends down a portion of at least one sidewall of the conductive feature 204. This impacts the profile of the air gap 1104. For example, the width of the air gap 1104 is greatest at a midpoint of the structure 1104. It is noted that FIG. 16 illustrates the device 1600 without the cap 206. However, in another embodiment of the device 1600, the cap 206 may be included on one or more of the features 204. In an embodiment, the cap 1002 extends on approximately 25% of a sidewall of the conductive feature 204. In an embodiment, the cap 1002 extends on approximately 50% of a sidewall of the conductive feature 204. In an embodiment, the cap 1002 extends on approximately 75% of a sidewall of the conductive feature 204. As illustrated in FIG. 15, in an embodiment the cap 1002 extends on approximately 100% of the sidewall of the feature 204. It is noted that the extent of the sidewall of the conductive feature 204 with the cap 1002 disposed thereon defines the profile (e.g., shape, width) of the air gap structure 1004. The profile of the air gap structure 1004 may determine its isolation performance. Thus, in one of the broader embodiments discussed herein, described is a method. The method includes forming a conductive feature in a dielectric layer on a substrate. A first hard mask layer and an underlying second hard mask layer are also formed on the substrate. The second hard mask layer has a higher etch selectivity to a plasma etch process than the first hard mask layer such that the second hard mask layer has a substantially lower etch rate in a plasma etch process than the first hard mask layer. The method continues to include performing plasma etch process to form a trench in the dielectric layer. The trench is adjacent the conductive feature. A cap is then formed over the trench to form an air gap structure adjacent the conductive feature.

In another of the broader embodiments, discussed is a method of semiconductor device fabrication including forming a conductive feature on a substrate. A first hard mask layer and an underlying second hard mask layer are formed on the substrate including overlying the conductive feature. A first etching process is performed on the first hard mask layer to form an opening in the first hard mask layer. The opening overlies the conductive feature. A second etching process is performed after the first etching process to remove the second hard mask layer under the opening of the first hard mask layer. The second etching process is a wet etch. A third etching process is then performed after the second etching process. The third etching process etches trenches in the substrate using the etched second hard mask layer as a masking element, wherein the conductive feature interposes the trenches.

In yet another embodiment, described is a device having a conductive feature disposed on a substrate; a cap structure is disposed on top of the conductive feature and on at least two sidewalls of the conductive feature. An air gap cap disposed on the cap structure and defines an air gap adjacent the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, the method comprising:
    forming a conductive feature in a dielectric layer on a substrate;
    forming a first hard mask layer and an underlying second hard mask layer on the substrate, wherein the second hard mask layer has a substantially lower etch rate in a plasma etch process than the first hard mask layer;
    performing the plasma etch process to form a trench in the dielectric layer, wherein the trench is adjacent the conductive feature; and
    forming a cap over the trench to form an air gap structure adjacent the conductive feature.

2. The method of claim 1, wherein the forming the conductive feature includes forming a feature of a multi-layer interconnect structure.

3. The method of claim 1, wherein the forming the conductive feature includes forming a conductive line that provides a conductive routing to a semiconductor device.

4. The method of claim 1, wherein performing the plasma etch process includes removing the first hard mask layer concurrently with forming the trench.

5. The method of claim 1, wherein the forming the cap includes forming an interface between the second hard mask layer and the cap.

6. The method of claim 1, wherein the forming the second hard mask layer includes depositing a composition of MxOyNz, wherein M is a metal, O is oxygen, and N is nitrogen, and wherein x>0 and y and z are ≥0.

7. The method of claim 6, wherein the forming the first hard mask layer includes depositing at least one of SiCN, SiN, SiO$_2$, and SiON.

8. The method of claim 6, wherein M is selected from the group consisting of Al, Mn, Co, Ti, Ta, W, Ni, Sn, and Mg.

9. The method of claim 1, further comprising:
    prior to performing the plasma etch process, forming a patterned photoresist feature on the first hard mask layer, wherein the patterned photoresist feature defines an opening region of the substrate;
    etching the first hard mask layer disposed on the opening region;
    stripping the patterned photoresist feature; and
    removing the second hard mask layer on the opening region after stripping the patterned photoresist feature.

10. The method of claim 9, wherein the removing the second hard mask layer on the opening region includes performing a wet etch process.

11. A method of semiconductor device fabrication, the method comprising:
    forming a conductive feature on a substrate;
    forming a first hard mask layer and an underlying second hard mask layer on the substrate including overlying the conductive feature;
    performing a first etching process on the first hard mask layer to form an opening in the first hard mask layer, wherein the opening overlies the conductive feature;
    performing a second etching process after the first etching process to remove the second hard mask layer under the opening of the first hard mask layer, wherein the second etching process is a wet etch; and
    performing a third etching process after the second etching process, wherein the third etching process etches trenches in the substrate using the etched second hard mask layer as a masking element, wherein the conductive feature interposes the trenches.

12. The method of claim 11, further comprising:
    forming a cap over the trench to define an air gap.

13. The method of claim 11, further comprising:
    after forming the trenches, forming a cap on the conductive feature, wherein the forming the cap includes selectively depositing cobalt on the conductive feature.

14. A method of making a semiconductor device, the method comprising:
    forming a conductive feature disposed on a substrate;
    forming a cap structure on top of the conductive feature and on at least one sidewall of the conductive feature; and
    forming an air gap structure adjacent the at least one sidewall of the conductive feature, wherein the forming the air gap structure includes:
    forming a trench; and
    forming a dielectric barrier layer on the cap structure and on a bottom wall of the trench; and
    forming an air gap cap structure over the trench to form the air gap structure.

15. The method of claim 14, wherein the cap structure includes cobalt.

16. The method of claim 14, wherein the cap structure includes a region of oxidation within the cap structure.

17. The method of claim 14, wherein the conductive feature is an interconnect feature providing an electrical path to a semiconductor device disposed on the substrate.

18. The method of claim 14, wherein a portion of the at least one sidewall of the conductive feature interfaces with a dielectric portion of the substrate.

19. The method of claim 14, wherein the cap structure is disposed on substantially the entire at least one sidewall of the conductive feature.

* * * * *